US010513462B2

(12) United States Patent
Feigelson et al.

(10) Patent No.: US 10,513,462 B2
(45) Date of Patent: *Dec. 24, 2019

(54) TRANSPARENT NANOCOMPOSITE CERAMICS BUILT FROM CORE/SHELL NANOPARTICLES (71) Applicant: The Government of the United States of America, as represented by the Secretary of the Navy, Arlington, VA (US)

(72) Inventors: Boris N. Feigelson, Springfield, VA (US); James A. Wollmershauser, Alexandria, VA (US); Kedar Manandhar, Alexandria, VA (US); Francis J. Kub, Arnold, MD (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 259 days.

This patent is subject to a terminal disclaimer.

(21) Appl. No.: 15/260,487

(22) Filed: Sep. 9, 2016

(65) Prior Publication Data
US 2017/0073276 A1 Mar. 16, 2017

Related U.S. Application Data
(60) Provisional application No. 62/217,095, filed on Sep. 11, 2015.

(51) Int. Cl.
C04B 35/443 (2006.01)
C04B 35/628 (2006.01)
(Continued)

(52) U.S. Cl.
CPC .......... *C04B 35/443* (2013.01); *C04B 35/115* (2013.01); *C04B 35/117* (2013.01);
(Continued)

(58) Field of Classification Search
CPC .... C04B 2235/3217; C04B 2235/3222; C04B 2235/656; C04B 2235/6567;
(Continued)

(56) References Cited

U.S. PATENT DOCUMENTS 6,613,383 B1* 9/2003 George .................... B01J 2/006
427/212
2006/0153728 A1* 7/2006 Schoenung ............... B22F 9/04
419/32
2015/0147590 A1 5/2015 Feigelson et al.

OTHER PUBLICATIONS

Zhang et al. "Related mechanism of transparency in MgAl2O4 nano-ceramics prepared by sintering under high pressure and low temperature". J Phys. D: Appl. Phys. 42 (2009) May 2002. (Year: 2009).*

(Continued)

Primary Examiner — Alexander M Weddle
(74) Attorney, Agent, or Firm — US Naval Research Laboratory; Joslyn Barritt (57) ABSTRACT A method for making transparent nanocomposite ceramics and other solid bulk materials from nanoparticle powders and transparent nanocomposite ceramics and other solid bulk materials formed using that method. A nanoparticle powder is placed into a reaction chamber and is treated to produce a clean surface powder. The clean surface powder is coated with a second material by means of p-ALD to produce core/shell or core multi shell nanoparticles having a coating or coatings of a other material surrounding the nanoparticle. The core/shell nanoparticles are cleaned and formed into green compact which is sintered to produce a transparent nanocomposite ceramic or other solid bulk mate- (Continued)

rial consisting of nanoparticles or core/shell nanoparticles uniformly embedded in a matrix of a different material, particularly in a matrix of a different ceramic material, formed by outer shell of initial core/shell. All steps are performed without exposing the material to the ambient.

23 Claims, 5 Drawing Sheets (51) Int. Cl.
| | |
|---|---|
| C04B 35/645 | (2006.01) |
| C23C 16/40 | (2006.01) |
| C23C 16/455 | (2006.01) |
| C04B 35/117 | (2006.01) |
| C04B 35/115 | (2006.01) |
| C23C 16/44 | (2006.01) |

(52) U.S. Cl.
CPC .. *C04B 35/62813* (2013.01); *C04B 35/62884* (2013.01); *C04B 35/645* (2013.01); *C23C 16/403* (2013.01); *C23C 16/4417* (2013.01); *C23C 16/45525* (2013.01); *C04B 2235/3217* (2013.01); *C04B 2235/3222* (2013.01); *C04B 2235/656* (2013.01); *C04B 2235/6567* (2013.01); *C04B 2235/80* (2013.01); *C04B 2235/9653* (2013.01)

(58) Field of Classification Search
CPC ........ C04B 2235/80; C04B 2235/9653; C04B 35/115; C04B 35/443
USPC .......................................................... 264/434
See application file for complete search history.

(56) References Cited

OTHER PUBLICATIONS

R.Z. Valiev, R.K. Islamgaliev, and I.V. Alexandrov, "Bulk nanostructured materials from severe plastic deformation," Progress in Materials Science (2000) 45, pp. 103-189.
A. Manaf, R.A. Buckley, and H.A. Davies, "New Nanocrystalline High-remanence Nd—Fe—B Alloys by Rapid Solidification," Journal of Magnetism and Magnetic Materials (1993) 128, pp. 302-306.
L.Q. Xing, J. Eckert, W. Loser, and L. Schultz, "High-strength materials produced by precipitation of icosahedral quasicrystals in bulk Zr—Ti—Cu—Ni—Al amorphous alloys," Applied Physics Letters (1999) 74, pp. 664-666.
C.B. Murray, S.H. Sun, W. Gaschler, H. Doyle, T.A. Betley, and C.R. Kagan, "Colloidal synthesis of nanocrystals and nanocrystal superlattices," IBM Journal of Research and Development (2001) 45, pp. 47-56.
F. Maglia, I.G. Tredici, and U. Anselme-Tamburini, "Densification and properties of bulk nanocrystalline functional ceramics with grain size below 50 nm," Journal of the European Ceramic Society (2013) 33 pp. 1045-1066.
J.E. Carsley, A. Fisher, W.W. Milligan, and E.C. Aifantis, "Mechanical behavior of a bulk nanostructured iron alloy," Metallurgical and Materials Transactions A (1998) 29, pp. 2261-2271.
Z. Zhang, F. Zhou, and E.J. Lavernia, "On the analysis of grain size in bulk nanocrystalline materials via X-ray diffraction," Metallurgical and Materials Transactions A (2003) 34A, pp. 1349-1355.
M.J. Mayo, "Processing of nanocrystalline ceramics from ultrafine particles," International Materials Reviews (1996) 41, pp. 85-115.
B. Poudel, Q. Hao, Y. Ma, Y.C. Lan, A. Minnich, B. Yu, X.A. Yan, D.Z. Wang, A. Muto, D. Vashaee, X.Y. Chen, J.M. Liu, M.S. Dresselhaus, G. Chen, and Z.F. Ren, "High-thermoelectric performance of nanostructured bismuth antimony telluride bulk alloys," Science (2008) 320, pp. 634-638.
R. Chaim, Z.Y. Shen, and M. Nygren, "Transparent nanocrystalline MgO by rapid and low-temperature spark plasma sintering," Journal of Materials Research (2004) 19, pp. 2527-2531.
S. Paris, E. Gaffet, F. Bernard, and Z.A. Munir, "Spark plasma synthesis from mechanically activated powders: a versatile route for producing dense nanostructured iron aluminides," Scripta Materialia (2004) 50, pp. 691-696.
I.-W. Chen and X.-H. Wang, "Sintering dense nanocrystalline ceramics without final stage grain growth," Nature (2000) 404, pp. 168-171.
S.-C. Liao, Y.-J. Chen, B.H. Kear, and W.E. Mayo, "High pressure/low temperature sintering of nanocrystalline alumina," Nanostructured Materials (1998) 10, pp. 1062-1079.
R. Castro and K. van Bentham, Sintering: Mechanisms of Convention Nanodensification and Field Assisted Processes (2012) vol. 35, pp. 204-205.
J. Schroeder and J. H. Rosolowski, "Light Scattering in Polycrystalline Materials," Proc. SPIE Intern. Soc. Opt. Eng. (USA), 297, 156-68 (1981).

* cited by examiner

TRANSPARENT NANOCOMPOSITE CERAMICS BUILT FROM CORE/SHELL NANOPARTICLES

CROSS-REFERENCE

This Application is a Nonprovisional of, and claims the benefit of priority under 35 U.S.C. § 119 based on, Provisional U.S. Patent Application No. 62/217,095 filed on Sep. 11, 2015. The Provisional Application and all references cited herein are hereby incorporated by reference into the present disclosure in their entirety.

TECHNICAL FIELD

The present invention relates to nanocomposite ceramics and other solid bulk materials, particularly to ceramics and other solid bulk materials consisting of nanoparticles or core/shell nanoparticles uniformly embedded in a matrix of a different material, particularly in a matrix of a different ceramic material.

BACKGROUND

A ceramic nanocomposite is a solid material consisting of multiple ceramic phases where the phases have dimensions of less than 100 nanometers (nm).

Nanocomposite materials can have properties not seen in their microcystalline counterparts and/or enhance/improve functional properties, such as mechanical strength, fracture toughness, optical transmission, optical absorption, corrosion resistance, thermal transport resistance, electrical conductivity, etc.

In general, these properties are improved or unveiled as the nanostructure of the material is refined. Bulk materials having improved or new properties from nano-scale microstructures can be used in numerous applications, including optical and detector devices, cathodes, high strength oxide and metals, nanocomposite magnets, superconductors, and thermoelectrics.

Properties of bulk materials with nano-size grains, including nano-ceramics, differ from properties of conventional bulk materials. Dense network of interfaces or grain boundaries between nano-grains increases hardness and strength, decreases thermal conductivity, etc. Light doesn't scatter on interfaces because of very small grain size which improve transparency of polycrystalline ceramics, like alumina, magnesium aluminate spinel ($MgAl_2O_4$). For example, it was shown that nano-spinel ($MgAl_2O_4$) ceramics with grain size of about 30 nm demonstrates 40% increase of hardness in comparison with the best micron and submicron grain spinel ceramics. See J. A. Wollmershauser, B. N. Feigelson, E. P. Gorzkowski, C. T. Ellis, R. Goswami, S. B. Qadri, J. G. Tischler, F. J. Kub, and R. K. Everett, "An extended hardness limit in bulk nanoceramics," *Acta Materialia*, 2014. 69(0): pp. 9-16.

Currently, bulk monolithic polycrystalline solids which have nano-scale elements in their microstructure are produced by a variety of processing approaches. These approaches include severe plastic deformation, solid state nano-precipitation, rapid solidification, consolidation/organization of colloidal crystals, sintering (including spark plasma sintering, hot pressing, hot isostatic pressing). See R. Z. Valiev, R. K. Islamgaliev, and I. V. Alexandrov, "Bulk nanostructured materials from severe plastic deformation," *Progress in Materials Science* (2000) 45, pp. 103-189; A. Manaf, R. A. Buckley, and H. A. Davies, "New Nanocrystalline High-remanence Nd—Fe—B Alloys by Rapid Solidification," *Journal of Magnetism and Magnetic Materials* (1993) 128, pp. 302-306; L. Q. Xing, J. Eckert, W. Loser, and L. Schultz, "High-strength materials produced by precipitation of icosahedral quasicrystals in bulk Zr—Ti—Cu—Ni—Al amorphous alloys," *Applied Physics Letters* (1999) 74, pp. 664-666; C. B. Murray, S. H. Sun, W. Gaschler, H. Doyle, T. A. Betley, and C. R. Kagan, "Colloidal synthesis of nanocrystals and nanocrystal superlattices," *IBM Journal of Research and Development* (2001) 45, pp. 47-56; F. Maglia, I. G. Tredici, and U. Anselme-Tamburini, "Densification and properties of bulk nanocrystalline functional ceramics with grain size below 50 nm," *Journal of the European Ceramic Society* (2013) 33 pp. 1045-1066; J. E. Carsley, A. Fisher, W. W. Milligan, and E. C. Aifantis, "Mechanical behavior of a bulk nanostructured iron alloy," *Metallurgical And Materials Transactions A* (1998) 29, pp. 2261-2271; Z. Zhang, F. Zhou, and E. J. Lavernia, "On the analysis of grain size in bulk nanocrystalline materials via X-ray diffraction," *Metallurgical And Materials Transactions A* (2003) 34A, pp. 1349-1355; M. J. Mayo, "Processing of nanocrystalline ceramics from ultrafine particles," *International Materials Reviews* (1996) 41, pp. 85-115; B. Poudel, Q. Hao, Y. Ma, Y. C. Lan, A. Minnich, B. Yu, X. A. Yan, D. Z. Wang, A. Muto, D. Vashaee, X. Y. Chen, J. M. Liu, M. S. Dresselhaus, G. Chen, and Z. F. Ren, "High-thermoelectric performance of nanostructured bismuth antimony telluride bulk alloys," *Science* (2008) 320, pp. 634-638; R. Chaim, Z. Y. Shen, and M. Nygren, "Transparent nanocrystalline MgO by rapid and low-temperature spark plasma sintering," *Journal of Materials Research* (2004) 19, pp. 2527-2531; and S. Paris, E. Gaffet, F. Bernard, and Z. A. Munir, "Spark plasma synthesis from mechanically activated powders: a versatile route for producing dense nanostructured iron aluminides," *Scripta Materialia* (2004) 50, pp. 691-696.

However, each of these known processing approaches has significant drawbacks. Some are limited to a narrow class of materials and narrow design of nanostructure. Other approaches retain porosity in the bulk material or incorporate foreign substances in the bulk material, while others dramatically change the length scale of the nanostructure or are limited in the achievable geometry of the fabricated material.

Severe plastic deformation involves using large strains and complex stress states to produce a material with a high defect density and an ultrafine or, for some materials, nanocrystalline grain structure. Because of the use of large strains the processing approach is most often limited to single phase metals and alloys. Additionally, nanocrystalline microstructures cannot be obtained in all metal materials and when achievable, the length scale is >50 nanometers. See Valiev, supra.

Solid state precipitation produces a multi-phase nanostructure by forming and growing a new phase within a parent phase to the size of nanoscale precipitates which are homogeneously distributed inside the parent phase. This is most often achieved by increasing the temperature of the material to a temperature where the second phase is stable to form nuclei of new phase, and then relatively fast cooling rates are used to stop growth the new phase and retain the nanostructure. Such a processing approach is limited to narrow range of material systems because it requires solubility of one material in another. Additionally, forming microstructures comprised primary of nanostructures is not possible in all systems because the size of the precipitate is fundamentally controlled by intrinsic diffusion rates and kinetics and modifications to processing parameters, such as cooling rate or anneal temperature (if system is super cooled), may not allow sufficient microstructural control. See Xing, supra.

Rapid solidification forms nano-crystalline and nano-quasicrystalline materials (mixture with amorphous or larger grain material) from very fast cooling of liquid. The microstructure length scale is determined by the nucleation and growth kinetics during the short timescale of the solidification process. Generally, cooling rates on the order of ~100,000 K/s can result in microstructures with length scales less than 1 micrometer. By increasing the solidification rate finer microstructure is obtained. However, the required fast cooling to produce nanocrystalline materials is most often only achievable when forming thin ribbon form factors. Therefore, bulk three-dimensional materials, such as those used in structural applications, are not possible. See Manaf, supra.

Colloidal crystals are ordered arrays of colloid particles, and when comprised of nano-sized colloid particles can be classified as a bulk nanomaterial. In general, the colloid particles can range in size from a few nanometers to micrometers and can be created from solution precipitation as single phase or multi-phase core-shell structures. The bulk properties of a colloidal crystal depend on the composition and size of the colloidal particle, as well as their arrangement/packing and degree of long range order. However, colloidal particles often have organic ligand and, therefore, the properties of colloidal crystal are also governed by these impurities, or if removed, porosity between the colloidal particles. See Murray, supra.

Sintering is a process of forming bulk materials from powder precursors through the application of heat and/or pressure. The process can be used with metals, ceramics, plastics, semiconductors, and other materials, where the powder precursors can range in size from nanometers to micrometers and can be single phase, two phase mixtures, or complex powder structures/mixtures. See Maglia, supra; Mayo, supra; and Poudel, supra; see also I.-W. Chen and X.-H. Wang, "Sintering dense nanocrystalline ceramics without final-stage grain growth," *Nature* (2000) 404, pp. 168-171.

Known sintering techniques include pressureless sintering, hot pressing, hot isostatic pressing, spark plasma sintering, and high pressure sintering. However, when starting from nanostructured powders, hot pressing and hot isostatic pressing form materials with non-nanoscale microstructures having a size greater than 100 nm. Spark-plasma sintering can be used to produce nanostructures in bulk form; however, this technique doesn't allow the nanoparticles to retain their initial size and structure, and the nanostructure size is limited to greater than 60-70 nanometers. See Chaim, supra; see also Paris, supra. Shorter sintering times or lower temperatures can be used to retain the nanostructure, but in such cases residual porosity remains. Binders and/or sintering aids can be used in hard to sinter materials, but can result in residual impurities or changes in the chemistry/stoichiometry at particle boundaries. See Carsley, supra; see also Zhang, supra.

High pressure (2 GPa-8 GPa) sintering has recently been used to form nanocrystalline materials from nanopowder. However, residual porosity and impurity content remain in the final product as a result of incomplete powder processing techniques and/or exposure to contamination after powder processing. These process artifacts ultimately influence the properties of the bulk nanostructured material. See S.-C. Liao, Y.-J. Chen, B. H. Kear, and W. E. Mayo, "High pressure/low temperature sintering of nanocrystalline alumina," *Nanostructured Materials* (1998) 10, pp. 1062-1079.

Thus, new processing techniques are required to create ceramic nanocomposites having no residual porosity and having nanoscale (less than 100 nm, more specifically less than 50 nm) ceramic constituents that are uniformly distributed and arranged in designated spatial order throughout the ceramic nanocomposite.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The subject of the present invention is nanocrystalline ceramic materials.

Another subject of the invention is nanocomposite nanocrystalline ceramic materials.

Another subject of the invention is transparent nanocomposite nanocrystalline ceramic materials.

Another subject of the invention is transparent nanocomposite nanocrystalline ceramic materials having enhanced mechanical, optical, and/or other physical properties.

Another subject of the invention is nanocomposite nanocrystalline ceramic materials made from ceramic core/shell and/or core/multi-shell nanoparticles.

Another subject of the invention is nanocomposite nanocrystalline ceramic materials consisting of ceramic nanoparticles embedded in another ceramic material or matrix.

Another subject of the invention is nanocomposite nanocrystalline ceramic materials consisting of ceramic core/shell nanoparticles embedded in another ceramic material or matrix.

The invention provides means to make nanocomposite nanocrystalline ceramic materials consisting of ceramic nanoparticles embedded in matrix of another ceramic material.

More specifically, the method of the present invention provides means for making nanocomposite nanocrystalline ceramic materials consisting of ceramic nanoparticles embedded in another ceramic material or matrix by consolidating core/shell and core/multi-shell nanoparticles of different ceramic materials.

This invention can be used to make transparent nanocomposite nanocrystalline ceramic materials comprising ceramic nanoparticles embedded in matrix of another ceramic material. The invented material is made from core/shell or core/multi shell nanoparticles sintered to a poreless solid material, where the material retains the nanoscale properties and nanostructure of the individual core/shell nanoparticles, with the matrix material consisting of the material of the outer shell of the initial core/shell nanoparticles.

These and other aspects of this invention can be accomplished by making core/shell ceramic nanoparticles and sintering these heterostructured ceramic nanoparticles to fully dense nanocomposite ceramics and other solid bulk materials which preserve the nanoscale properties and heterostructure of the individual ceramic core/shell nanoparticles and have phases arranged in a designated spatial order.

The present invention utilizes aspects of the Enhanced High Pressure Sintering (EHPS) method developed by the inventors of the present invention and described in U.S.

Patent Application Publication No. 2015/0147590, the entirety of which is hereby incorporated by reference into the present disclosure.

In accordance with the present invention, a nanoparticle (less than 100 nm, more specifically, less than 50 nm) powder is placed into a reaction chamber and is treated at an elevated predetermined temperature under a flow of a predetermined gas to remove contaminants and adsorbants from the surface of the particles to produce a powder consisting of nanoparticles having a pristine surface and highest chemical potential. The cleaned powder is placed into a particle Atomic Layer Deposition (p-ALD) chamber, where the nanoparticles forming the powder are coated with one or more nanolayers of one or more other materials resulting in core/shell or core/multi-shell nanoparticles (resulting size less than 100 nm, more specifically less than 50 nm) having mechanical, physical and chemical properties different from those of the original nanoparticle. The core/shell nanoparticles are cleaned and then are formed into a low density pre-shaped, or "green," compact. The green compact is then placed in a high-pressure device and is sintered at a temperature below conventional sintering temperatures to produce a transparent nanocomposite ceramic solid or other solid bulk material having a retained nanostructure or nano-heterostructure corresponding to the nanostructure of the constituent nanoparticles.

In all embodiments, once the powder is placed into the reaction chamber, it is not exposed to the ambient air at any time until the processing is complete and the bulk monolithic material is produced.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

As noted above, the mechanical and physical properties of nanostructured bulk materials can be further altered and improved if two or more different materials are combined together in one bulk material where each material has nanoscale dimensions.

The present invention provides a new nanocomposite material made from core/shell or core/multi shell nanoparticles sintered to a poreless solid material, where the material retains the nanoscale properties and nanostructure of the individual core/shell nanoparticles, with the matrix material consisting of the material of the outer shell of the initial core/shell nanoparticles. A material in accordance with the present invention can be made by making core/shell or core/multi-shell nanoparticles which can then be sintered into a monolithic bulk material that still preserves the nanoscale and spatial phase arrangement of the initial core/shell nanoparticles. Such a nanocomposite material can be described as a "nanocomposite with nanocoated nanograins."

The present invention provides a method for making transparent nanocomposite ceramics and other solid bulk materials formed from a plurality of different materials and further provides transparent nanocomposite ceramics and other solid bulk materials formed using that method.

More specifically, the present invention provides a method for making transparent nanocomposite ceramics and other solid bulk materials by consolidating nanoparticles, core/shell and/or core/multi-shell nanoparticles comprising different materials, where the resulting nanocomposite ceramic retains the nanoscale structure of the initial core/shell nanoparticles.

The method of the present invention can be used to form transparent nanocomposite ceramics or other solid bulk materials comprising metals, semiconductors, insulators, and combinations thereof.

The invented material is made from core/shell or core/multi shell nanoparticles sintered to a poreless solid material, where the material retains the nanoscale properties and nanostructure of the individual core/shell nanoparticles, with the matrix material consisting of the material of the outer shell of the initial core/shell nanoparticles.

The present invention utilizes aspects of the Enhanced High Pressure Sintering (EHPS) method developed by the inventors of the present invention and described in U.S. Patent Application Publication No. 2015/0147590, the entirety of which is hereby incorporated by reference into the present disclosure.

As noted above, one of the main goals of this invention is to provide a process which allows the sintering of nanoparticles of different materials to produce such a monolithic (i.e., fully dense) solid bulk material that retains the nanostructure of the initial nanoparticles, without using any binders or sintering activators which can change the properties of the final material.

Sintering provides a universal approach to make bulk nanostructures of ceramics, semiconductors and metals, but traditional sintering based technique, including Spark Plasma Sintering, microwave sintering and conventional high pressure sintering has not demonstrated successes in producing fully dense bulk materials with grain sizes of less than 50 nm.

The present invention is based on the idea that sintering of nanopowders to fully dense materials with retained nanostructures (i.e., grain sizes) smaller than 50 nm can be achieved as the result of the synergy of multiple phenomena, including (1) the effects related to the high surface area/curvature of nanoparticles combined with proper surface termination resulting in the highest surface chemical potential, (2) the application of sufficiently high external pressures, and (3) sintering at temperatures below the traditional sintering temperature of about seven-tenths of the melting temperature (0.7 Tm) of the material.

The highest surface energy and sintering activity of nanoparticles is possible only when the nanoparticles are free from surface contaminants. Such surface activity promotes surface energy-driven diffusional processes that lead to the initiation of sintering at temperatures of 0.2-0.4 Tm, primarily via necking between nanoparticles and further grain boundary diffusion.

External high pressures serve (1) to place the nanoparticles in very close proximity to one another and (2) to create ultra-high contact pressures between nanoparticles, promoting interdiffusion and sintering. Application of ultra-high contact pressures on small contact areas between particles drive up stresses at the particle interfaces and further enhance grain boundary diffusion that alleviate localized stresses by densifying the powders without coarsening of the grain size. Such ultra-high contact pressures also cause plastic deformation at the interfaces between nanoparticles and plastic flow regardless of the nature of nanoparticles, leading to sufficient densification and potentially providing additional diffusional pathways (dislocation pipe diffusion) that promote bulk diffusion over surface diffusion related to coarsening.

Sintering at temperatures below 0.7 Tm allows the sintering of nanoparticles without their grain coarsening. Thus, in accordance with the present invention, by providing the proper surface termination of the starting nanoparticles and applying sintering temperatures of less than 0.7 Tm under external pressures, a fully dense solid that maintains the nanostructure of the original particles without grains coarsening can be produced.

FIG. 1 and FIGS. 2A-2C illustrate an exemplary process flow of a process for sintering nanoparticles to produce a fully dense monolithic material that maintains the nanoscaled microstructure of the original nanoparticles in accordance with the present invention. The process in accordance with the present is not tied to any specific type of enclosure, p-ALD reactor, or high-pressure equipment, and any suitable such equipment may be used. In addition, in some embodiments, different parts of the process can occur within different reaction chambers of the same or different types.

Importantly, however, in all cases, once the powder is placed into the first enclosure, it is essential that it not be exposed to the ambient air, i.e., the atmosphere surrounding the enclosure, at any time until the sintering process is complete and the fully dense transparent nanocomposite ceramic or other solid bulk material is produced.

Figure 1:
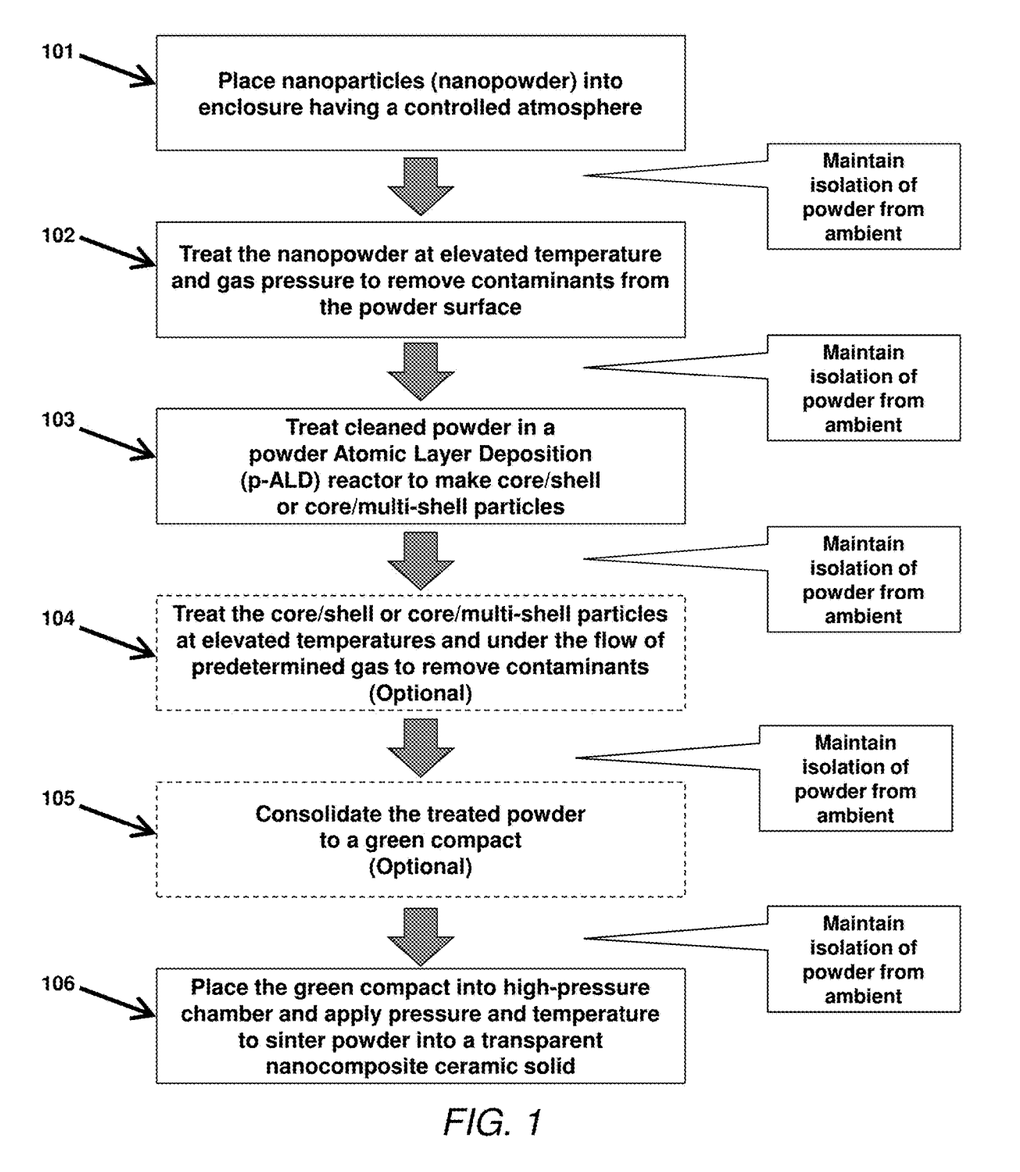
FIG. 1 is a flow diagram illustrating exemplary steps in a method for making a nanocomposite ceramic in accordance with one or more aspects of the present disclosure.

The process begins at step 101 shown in FIG. 1, in which the starting material, i.e., the nanoparticle powder, is placed in an enclosure having a controlled temperature and a controlled atmosphere. Particles in the powder can be ceramic, metal, or semiconductor with sizes typically smaller than 50 nm, though larger particles having a size between 50 and 100 nm, or even greater than 100 nm, can be used in some embodiments. In some embodiments, the starting material can consist of a single material with all particles having the same particle size or different particle size, while in other embodiments it can be a mixture of materials having the same or different particle sizes.

Between steps 101 and 102, the powder is not exposed to the ambient at any time.

At step 102, the powder in the chamber is treated at a first predetermined cleaning temperature $T_{c1}$ and under the flow of a predetermined first gas for a first predetermined cleaning time $t_{c1}$, typically more than about 10 minutes, to remove contaminants and adsorbents such as $H_2O$, hydrocarbons, oxygen, etc., from the surface of the particles to produce particles having a pristine surface and the highest chemical potential. The first predetermined cleaning temperature $T_{c1}$ for this first cleaning treatment step 102 can be in the range of room temperature (RT) up to 2000° C. depending on the on the size, nature, and morphology of the particles. The first gas can be any suitable gas, including but not limited to pure $H_2$, Ar, $N_2$, $CH_4$, $O_2$, and mixtures thereof, depending on the nature of the particles.

Between steps 102 and 103, the powder is not exposed to the ambient at any time.

Figure 2A:
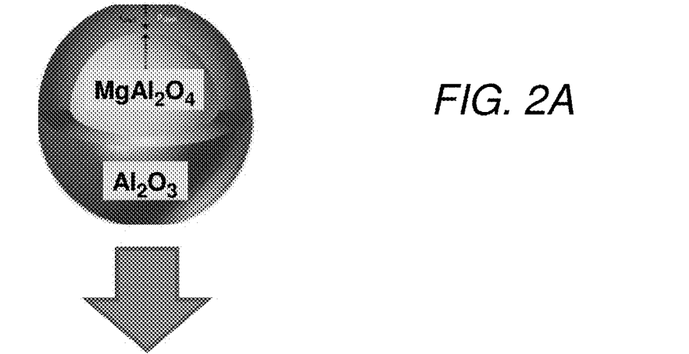
FIGS. 2A-2C further illustrate aspects of a method for producing $MgAl_2O_4$ spinel/$Al_2O_3$ alumina composite core/shell transparent ceramics with spinel nanoparticles embedded in alumina matrix in accordance with the present invention.

At step 103, the treated nanoparticles are transferred to a particle atomic layer deposition (p-ALD) reactor where the nanoparticles are coated with one or more nanolayers of one or more ceramic, metal, or semiconductor materials to produce a nanoparticle powder comprising core/shell or core/multi-shell nanocomposite particles such as the exemplary $MgAl_2O_4$ spinel/$Al_2O_3$ alumina core/shell nanoparticle illustrated by the schematic shown in FIG. 2A, where the nanocomposite nanoparticles have mechanical, physical, and/or chemical properties different from those of the original nanoparticles. The final sizes of the core/shell nanoparticles produced in this step 103 will typically be smaller than 50 nm, though in some embodiments the core/shell nanoparticles can have sizes between 50 and 100 nm or even greater. It should be noted that the use of p-ALD at step 103 is merely exemplary, and any other appropriate technique such as electrodeposition can be used to make the core/shell nanoparticles and all such techniques are within the scope of the invention.

Between steps 103 and 104, the core/shell nanocomposite particles are not exposed to the ambient at any time.

At step 104, the core/shell nanocomposite particles can be treated at a second predetermined cleaning temperature $T_{c2}$ under the flow of a predetermined second gas for a predetermined second cleaning time $t_{c2}$, typically more than about 10 minutes, to remove contaminants and adsorbents from the surface of the core/shell nanocomposite particles. The second predetermined cleaning temperature $T_{c2}$ for this second cleaning treatment step 104 can be in the range of room temperature (RT, typically about 20° C.), up to 2000° C. depending on the on the size, nature, and morphology of the core/shell nanocomposite particles, while the second gas can be any suitable gas, including but not limited to pure $H_2$, Ar, $N_2$, $CH_4$, $O_2$, and mixtures thereof, depending on the nature of the core/shell nanocomposite particles. It will be noted here that this second cleaning step is optional and may be omitted in some embodiments.

Between steps 104 and 105, the core/shell nanocomposite particles are not exposed to the ambient at any time.

Figure 2B:
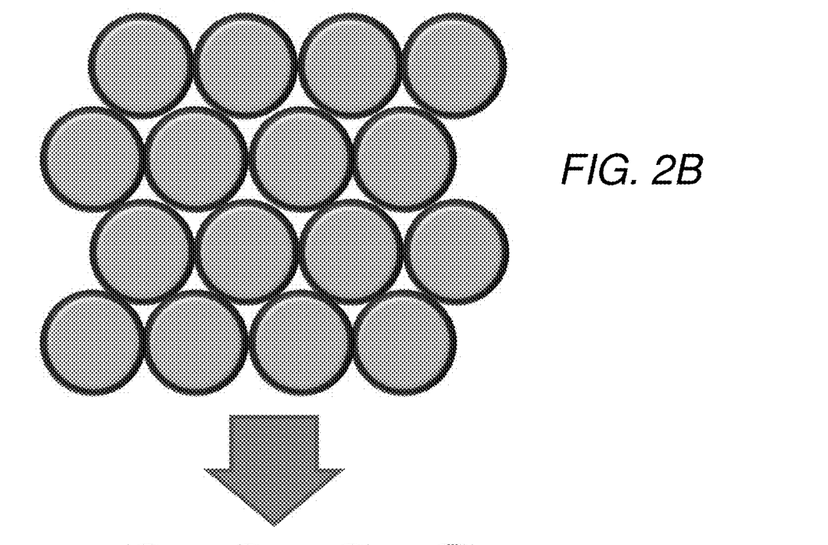

At step 105 of the method in accordance with the present invention, the pristine core/shell nanocomposite particles optionally can be consolidated into a preformed, or "green," compact such as the compact illustrated in the block schematic shown in FIG. 2B as a precursor to the sintering step. The green compact is formed at pressures and temperatures which are lower than the actual sintering pressure and temperature, and typically has a density in the range of about 40-90% depending on the material, which allows the compact to retain its shape. Pressures for making a "green" compact are usually in the range of 0.1 GPa-1.5 GPa and temperature is usually room temperature; however, one skilled in the art will recognize that such pressures and temperatures are merely exemplary and that other pressures and temperatures may be used as appropriate. This consolidation step is optional and can be omitted in some embodiments, and in such cases, the nanocomposite particles remain in their loose powder form.

Between steps 105 and 106, the green compact is not exposed to the ambient at any time.

Finally, at step 106, the green compact (or loose nanocomposite particle powder if a green compact is not formed at step 105) is placed inside a high-pressure reaction chamber and is sintered at a predetermined pressure P and a predetermined sintering temperature $T_s$ for a predetermined sintering time $t_s$, typically more than one second, to produce a transparent nanocomposite ceramic solid or other solid bulk material having a density of not less than 99% (porosity of less than 1%). As with the case between steps 101/102, 102/103, 103/104, and 104/105, isolation of the green compact (or loose nanocomposite particle powder if the green compact is not formed) from the ambient air is maintained between steps 105 and 106, e.g., by transferring the green compact or powder by means of an air-tight conduit between chambers in the reaction vessel or using a sealed capsule. In exemplary embodiments, the applied pressure P is in the range of 2 bar-60,000 bar, typically greater than 100 bar, and the applied sintering temperature $T_s$ is less than 0.7 Tm, usually about 0.3-0.4 Tm, i.e., in the range of room temperature (RT) to about 2500° C., typically above 100° C. However, one skilled in the art will readily recognize that pressure P and sintering temperature $T_s$ can have any suitable values depending on the size, morphology, and nature of the constituent powders.

The combination of the pristine surface of the core/shell nanocomposite particles, the application of pressure, and the use of temperatures below 0.7 Tm allows the sintering of the core/shell nanocomposite particles without coarsening or causing grain growth in the final solid material. The applied pressure P and applied sintering temperature $T_s$ may be interrelated such that in some cases sintering at a higher pressure and lower temperature or at a lower pressure and a higher temperature may provide sufficient sintering to produce a fully densified material while preventing grain coarsening.

After completion of step 106, the resulting monolithic body of the material can be exposed to the ambient or to the environment for which the material was made without compromising its designed properties.

The new process allows the sintering of core/shell nanocomposite particles having different natures with particle size of 100 nm or less, typically 50 nm or less, to produce a fully dense solid bulk material that retains the nanostructure of the initial particles. The process in accordance with the present invention can also be applied to powders having a particle size larger than 50 nm or a mixture of the powders with particle sizes smaller and/or larger than 50 nm to sinter them to a fully dense bulk material having the retained nanostructure of the initial core/shell particles.

Figure 2C:
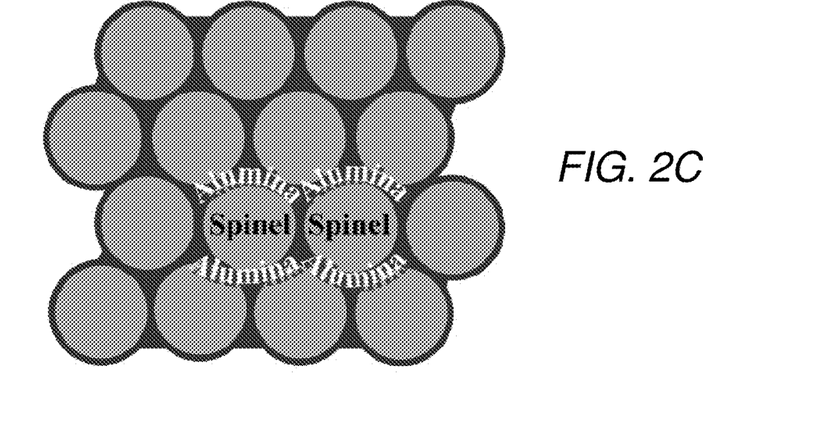

The new process in accordance with the present invention allows the production of transparent nanocomposite ceramics and other solid bulk materials, particularly ceramics and other solid bulk materials consisting of nanoparticles or core/shell nanoparticles uniformly embedded and equally separated in a matrix of a different material, particularly in a matrix of a different ceramic material comprising the material of the outer shell of the initial core/shell nanoparticles. The block schematic shown in FIG. 2C illustrates aspects of such a solid bulk material produced using the method of the present invention, in which the spinel/alumina nanocomposite nanoparticles of FIG. 2A are sintered into a bulk material comprising spinel nanoparticles uniformly embedded in an alumina matrix.

The process and material of the present invention is further illustrated in the context of the following Example. It should be noted that the materials and reaction conditions described below are merely exemplary and do not in any way restrict or limit the scope of the invention described in the present disclosure.

EXAMPLE

FIGS. 3A-3F illustrate aspects of exemplary core/shell nanoparticles and physical properties of solid bulk materials produced therefrom in accordance with the present invention.

In this Example, magnesium aluminate spinel (c) nanopowder having a particle size of about 30 nanometers was placed in an alumina boat and heated to about 1000° C. in a furnace with flowing oxygen gas to remove impurities including moisture, carbonates, and hydrocarbons. The cleaned powder was then transferred to an enclosure that contains a dry nitrogen environment without exposing the cleaned powder to the ambient air.

Figure 3A:
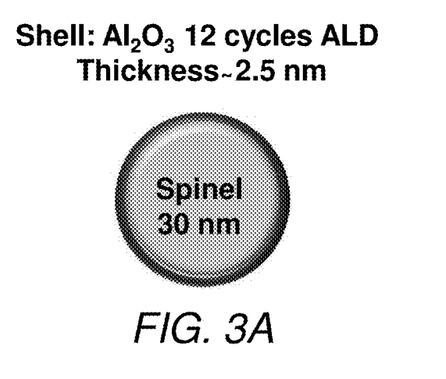
FIGS. 3A-3F illustrate aspects of exemplary $MgAl_2O_4$ spinel/$Al_2O_3$ alumina core/shell nanoparticles and solid bulk materials formed therefrom in accordance with the present invention.
Figure 3B:
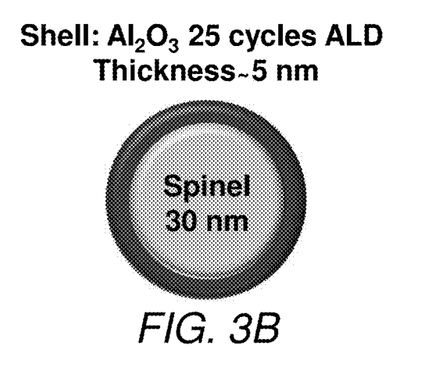

The cleaned magnesium aluminate nanopowder was then transferred to a p-ALD rotary reactor and coated with cycles of Trimethylaluminum (TMA) and DI $H_2O$ to grow alumina ($Al_2O_3$) on the nanoparticles of the powder. After 12 ALD cycles of alumina deposition, an $Al_2O_3$ shell having a thickness of about 2.5 nm was produced on the powder, as illustrated by the block diagram in FIG. 3A, while 25 ALD cycles resulted in a powder of spinel/$Al_2O_3$ core-shell nanocomposite particles having an $Al_2O_3$ shell having a thickness of about 5 nm, as shown in FIG. 3B.

Particles of each size were compacted and sintered into solid bulk materials in accordance with the process steps described above. Thus, in accordance with the process of the present invention, the spinel/$Al_2O_3$ core/shell nanocomposite particles were transferred from the p-ALD reactor to a furnace without being exposed to air, and were heated to about 800° C. in a furnace with flowing oxygen gas to remove impurities from the surface of the particles.

After the cleaning treatment, the spinel/$Al_2O_3$ core/shell nanocomposite particles were transferred to an enclosure that contains a dry nitrogen environment without the cleaned particles being exposed to the ambient atmosphere.

The spinel/$Al_2O_3$ core/shell nanocomposite particles were then compacted into a green compact with a relative density ranging from 40-60%. The green compact was transferred without exposure to the ambient atmosphere to a high pressure device container and was treated at elevated pressure of about 20 kbar and elevated temperature of about 800° C. for about 15 minutes to transform the green compact into a nanocomposite nanocrystalline ceramic material consisting of magnesium aluminate nanoparticles embedded in an alumina ceramic, i.e., a nanocomposite nanocrystalline ceramic material consisting of magnesium aluminate, i.e., spinel, nanograins nanocoated with alumina, similar to that illustrated in the block diagram in FIG. 2C. After completion of the elevated pressure and temperature treatment, the core-shell spinel/alumina nanocomposite ceramic was brought back to standard pressure and temperature by lowering the pressure and temperature in the reaction chamber.

Figure 3C:
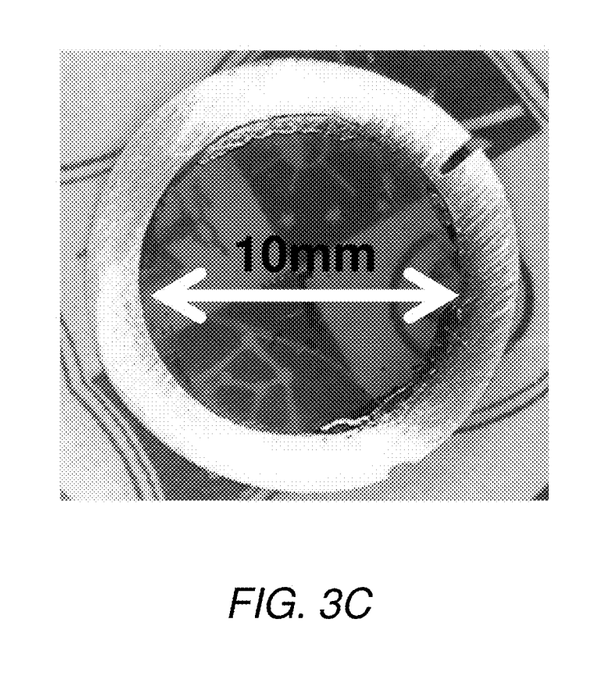

The resulting transparent spinel/alumina nanocomposite ceramic was then removed from the reaction chamber. An optical image of a sample of the ceramic produced from $MgAl_2O_4$ spinel/$Al_2O_3$ alumina nanoparticles in accordance with the present invention is shown in FIG. 3C.

Figure 3D:
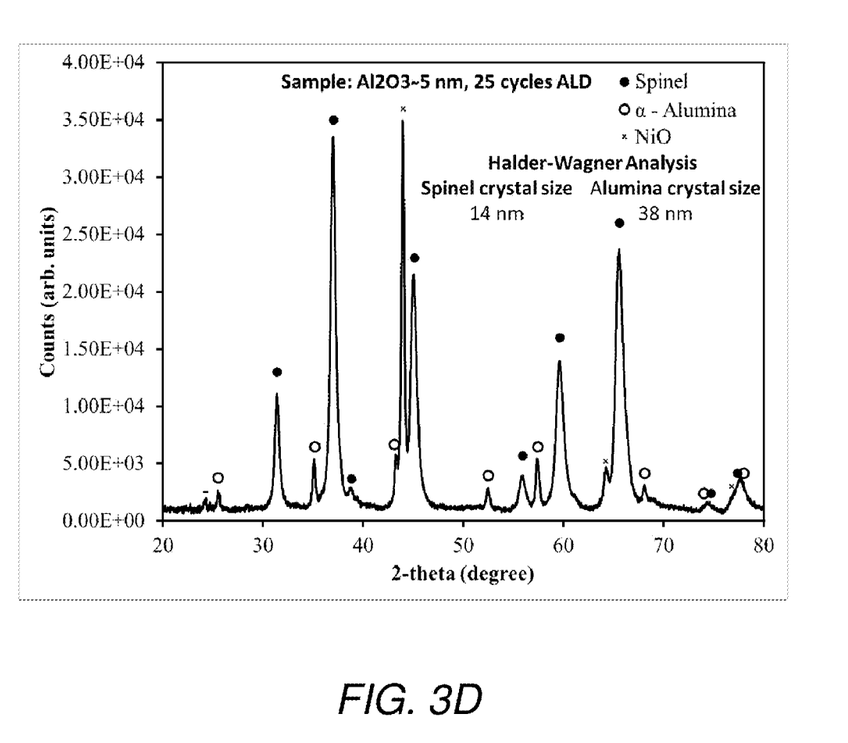

The resulting materials were then analyzed. X-ray diffraction of the ceramic, the results of which are shown in FIG. 3D, shows broad peaks which are typical of nanocrystalline material with other impurity phases. As can be seen from the plot in FIG. 3D, using the Halder-Wagner type analysis, the crystallite size is determined to be 28 nanometers.

In addition, the hardness and fracture toughness of the material produced by particles having a 2.5 nm and a 5 nm alumina shell was measured and was compared to bulk nanostructured spinel produced by uncoated nanoparticles with the same nanograin size as spinel/alumina material.

Figure 3E:
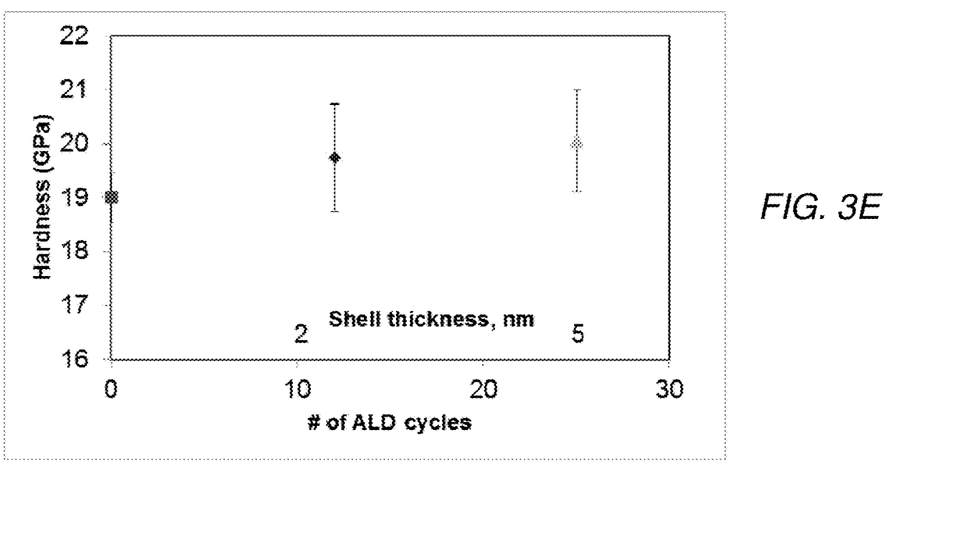
Figure 3F:
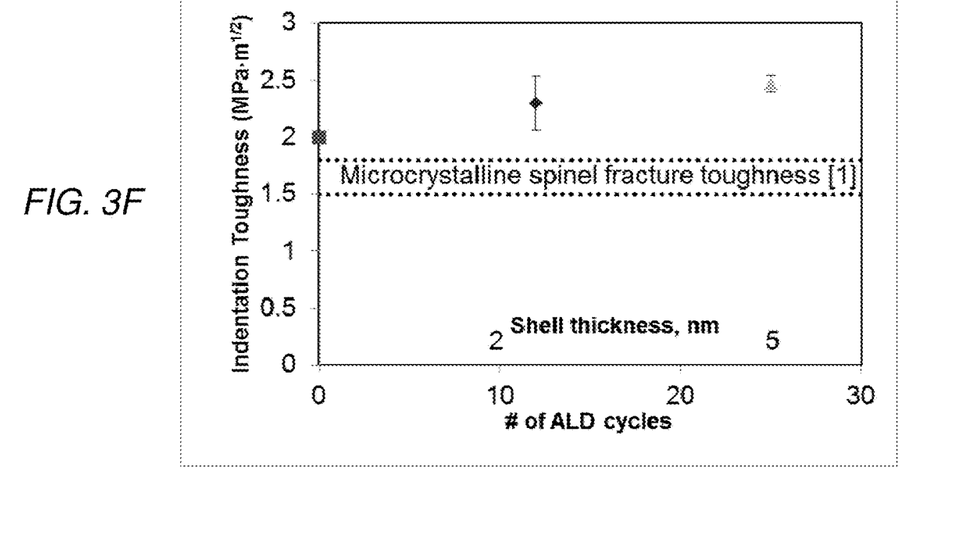

The hardness was measured by microhardness indentation. As shown in FIG. 3E, the hardness of the spinel/alumina ceramic produced from spinel core/alumina shell nanoparticles in accordance with the method of the present invention was determined to be about 20 GPa, which was higher than the hardness measured for a conventional magnesium aluminate ceramic produced from uncoated nanoparticles. Similarly, as shown in FIG. 3F, the fracture toughness of a spinel/alumina nanocomposite ceramic produced from coated nanoparticles in accordance with the present invention is about 20% higher than the fracture toughness of a conventional nanocrystalline magnesium aluminate ceramic produced from uncoated nanoparticles.

CONCLUSION

Materials exhibit unexpected atypical and often exceptional properties when scaled down to nanostructures. The basic challenge is centered on how to produce designed bulk (3D) nanostructured materials with the required nano-scaled phases (including scales less than 50 nm) arranged in the designed order, which are at the same time fully dense without porosity and unwanted phases. The invention discloses a new process to make, using nanoparticles as building blocks, ceramics and other solid bulk materials consisting of nanoparticles or core/shell nanoparticles uniformly embedded in a matrix of a different material, particularly in a matrix of a different ceramic material. The present invention also provides new ceramics and other solid bulk materials made make from nanoparticles, as building blocks, and consisting of nanoparticles or core/shell nanoparticles uniformly embedded in a matrix of a different material, particularly in a matrix of a different ceramic material.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A process for making a transparent nanocomposite solid bulk material, the process including:
    providing a powder comprising a plurality of nanoparticles of at least one material;
    placing the powder inside an enclosure having a controlled gas atmosphere;
    without exposing the powder to an ambient air, subjecting the powder to a first predetermined cleaning temperature $T_{c1}$ for a first predetermined cleaning time $t_{c1}$ to clean the nanoparticles and provide a cleaned powder comprising cleaned nanoparticles having a surface free from contaminants;
    without exposing the cleaned powder to the ambient atmosphere, transferring the cleaned powder to a powder Atomic Layer Deposition (p-ALD) reactor and coating the cleaned nanoparticles with one or more shell nanolayers to form a plurality of core/shell nanocomposite particles each comprising a core nanoparticle having an outer shell formed from one or more nanolayers of a material different from a material forming the core;
    without exposing the core/shell nanocomposite particles to the ambient atmosphere, subjecting the core/shell nanocomposite particles to a predetermined pressure P greater than 100 bar and a predetermined sintering temperature $T_s$ for a predetermined sintering time $t_s$, the sintering temperature $T_s$ being less than about 0.4 times the melting point $T_m$ of the material;
    wherein the pressure P, sintering temperature $T_s$, and sintering time $t_s$ are configured to sinter the core/shell nanocomposite particles to a transparent nanocomposite solid bulk material having a density of not less than 99% without any coarsening or growth of a grain size of the nanoparticles;
    wherein the solid bulk material comprises the core nanoparticles uniformly embedded in a matrix of a solid material comprising the material of the outer shell of the initial core/shell nanoparticles; and
    wherein the solid bulk material retains the original grain sizes, original nanostructure, and original spatial phase arrangement of the individual core/shell nanoparticles within the matrix material.

2. The process according to claim 1, wherein the temperature $T_{c1}$ is greater than 100° C.

3. The process according to claim 1, wherein the time $t_{c1}$ is greater than 10 minutes.

4. The process according to claim 1, further comprising subjecting the core/shell nanocomposite particles to a second predetermined cleaning temperature $T_{c2}$ for a second predetermined cleaning time $t_{c2}$ without exposing them to the ambient atmosphere to clean the core/shell nanocomposite particles and provide core/shell nanocomposite particles having a surface free from contaminants.

5. The process according to claim 4, wherein the temperature $T_{c2}$ is greater than 100° C.

6. The process according to claim 4, wherein the time $t_{c2}$ is greater than 10 minutes.

7. The process according to claim 1, wherein the temperature $T_s$ is between 100° C. and 1300° C.

8. The process according to claim 1, wherein the pressure P is between 2 and 100 bar.

9. The process according to claim 1, wherein the pressure P is between 100 bar and 6 GPa.

10. The process according to claim 1, wherein the controlled gas atmosphere comprises $H_2$, Ar, $N_2$, $CH_4$, $O_2$, or mixtures thereof.

11. The process according to claim 1, further comprising making a preformed green compact from the core/shell nanocomposite particles without exposing the core/shell nanocomposite particles to the ambient atmosphere;
    wherein the green compact is subjected to the predetermined pressure P and a predetermined sintering temperature $T_s$ for a predetermined sintering time $t_s$ to produce the transparent nanocomposite solid bulk material.

12. The process according to claim 1, wherein the nanoparticles comprise particles of a plurality of materials.

13. The process according to claim 1, wherein the nanoparticles include particles of at least one metal.

14. The process according to claim 1, wherein the nanoparticles include particles of at least one nonmetal.

15. The process according to claim 1, wherein the nanoparticles comprise a mixture of metals and nonmetals.

16. The process according to claim 1, wherein the nanoparticles have a diameter of less than 50 nm.

17. The process according to claim 1, wherein a grain size of the transparent nanocomposite solid bulk material is less than 50 nm.

18. The process according to claim 1, wherein the nanocomposite solid bulk material is a nanocomposite ceramic.

19. The process according to claim 18, wherein the transparent nanocomposite ceramic is an oxide ceramic.

20. The process according to claim 1, wherein the solid bulk material is a nanocomposite ceramic comprising core nanoparticles formed from a first ceramic material uniformly embedded in a matrix of a second ceramic material.

21. The process according to claim 20, wherein the solid bulk material comprises $MgAl_2O_4$ spinel nanoparticles uniformly embedded in alumina $Al_2O_3$ matrix.

22. A product made by the process of claim 1.

23. A product made by the process of claim 11.

* * * * *